(12) United States Patent
Dahal et al.

(10) Patent No.: US 11,485,678 B2
(45) Date of Patent: Nov. 1, 2022

(54) CHEMICAL VAPOR DEPOSITION PROCESS FOR FORMING A SILICON OXIDE COATING

(71) Applicant: PILKINGTON GROUP LIMITED, Lathom (GB)

(72) Inventors: Lila Raj Dahal, Perrysburg, OH (US); Douglas Martin Nelson, Curtice, OH (US); Jun Ni, Maumee, OH (US); David Alan Strickler, Toledo, OH (US); Srikanth Varanasi, Ottawa Hills, OH (US)

(73) Assignee: Pilkington Group Limited, Lathom (GB)

( * ) Notice: Subject to any disclaimer, the term of this patent is extended or adjusted under 35 U.S.C. 154(b) by 0 days.

(21) Appl. No.: 16/640,118

(22) PCT Filed: Aug. 31, 2018

(86) PCT No.: PCT/GB2018/052464
§ 371 (c)(1),
(2) Date: Feb. 19, 2020

(87) PCT Pub. No.: WO2019/043399
PCT Pub. Date: Mar. 7, 2019

(65) Prior Publication Data
US 2021/0130229 A1    May 6, 2021

Related U.S. Application Data

(60) Provisional application No. 62/552,713, filed on Aug. 31, 2017.

(51) Int. Cl.
*C23C 16/40* (2006.01)
*C03C 17/245* (2006.01)
(Continued)

(52) U.S. Cl.
CPC .......... *C03C 17/245* (2013.01); *C23C 16/402* (2013.01); *C23C 16/453* (2013.01);
(Continued)

(58) Field of Classification Search
CPC .... C23C 16/545; C23C 16/401; C23C 16/453
See application file for complete search history.

(56) References Cited

U.S. PATENT DOCUMENTS 4,557,950 A * 12/1985 Foster ............... H01L 21/02129
438/774
4,922,853 A    5/1990 Hofer
(Continued)

FOREIGN PATENT DOCUMENTS

CN    103946173 A    7/2014
EP    0879802 A2     11/1998
(Continued)

OTHER PUBLICATIONS

European Patent Office, International Search Report with Written Opinion, issued in PCT/GB2018/052464, dated Oct. 30, 2018, 10 pages, European Patent Office, Rijswijk, Netherlands.
(Continued)

*Primary Examiner* — Joseph A Miller, Jr.
(74) *Attorney, Agent, or Firm* — Marshall & Melhorn, LLC

(57) ABSTRACT

A chemical vapor deposition process for forming a silicon oxide coating includes providing a moving glass substrate. A gaseous mixture is formed and includes a silane compound, a first oxygen-containing molecule, a radical scavenger, and at least one of a phosphorus-containing compound and a boron-containing compound. The gaseous mixture is directed toward and along the glass substrate. The gaseous mixture is reacted over the glass substrate to form
(Continued)

a silicon oxide coating on the glass substrate at a deposition rate of 150 nm*m/min or more.

15 Claims, 1 Drawing Sheet

(51) Int. Cl.
    *C23C 16/453*     (2006.01)
    *C23C 16/54*     (2006.01)

(52) U.S. Cl.
    CPC ...... *C23C 16/545* (2013.01); *C03C 2217/213* (2013.01); *C03C 2218/1525* (2013.01)

(56) References Cited

U.S. PATENT DOCUMENTS

| | | |
|---|---|---|
| 5,401,305 A | 3/1995 | Russo et al. |
| 5,599,387 A | 2/1997 | Neuman et al. |
| 6,106,892 A * | 8/2000 | Ye .................. C03C 17/245 427/109 |
| RE41,799 E | 10/2010 | Russo et al. |
| 8,133,599 B2 | 3/2012 | Lu et al. |
| 8,685,490 B2 | 4/2014 | Lu et al. |
| 8,734,903 B2 | 5/2014 | Nelson |
| 9,224,892 B2 | 12/2015 | Lu |
| 9,366,783 B2 | 6/2016 | Lu |
| 9,404,179 B2 | 8/2016 | Nelson et al. |
| 9,540,277 B2 | 1/2017 | Nelson et al. |
| 9,776,914 B2 | 10/2017 | Wang et al. |
| 2002/0000644 A1* | 1/2002 | Jeon .................. H01L 21/02271 438/782 |
| 2005/0221003 A1 | 10/2005 | Remington, Jr. |
| 2010/0285290 A1 | 11/2010 | Lu |
| 2011/0146768 A1 | 6/2011 | Lu |
| 2012/0172209 A1 | 7/2012 | Lu |
| 2013/0129945 A1 | 5/2013 | Durandeau et al. |
| 2013/0316140 A1 | 11/2013 | Lu |
| 2013/0333752 A1 | 12/2013 | Lu |
| 2016/0305021 A1 | 10/2016 | Nelson et al. |
| 2017/0210666 A1 | 7/2017 | Chang et al. |
| 2021/0155535 A1 | 5/2021 | Dahal |

FOREIGN PATENT DOCUMENTS

| | | |
|---|---|---|
| FR | 2963343 A1 | 2/2012 |
| WO | 2010/059507 A1 | 5/2010 |
| WO | 2011084297 A2 | 7/2011 |
| WO | WO 2013/041840 A1 | 3/2013 |
| WO | 2013/136052 A2 | 9/2013 |

OTHER PUBLICATIONS

CNIPA, Chinese Patent Office, First Office Action issued in the corresponding Chinese patent application No. 201880056124.8; dated Nov. 29, 2021; 22 pages; CNIPA, Beijing, China.

Jin Dexuan et al.; VLSI Technology Very Large Scale Integration Circuit Technology; dated Nov. 30, 1985; 3 pages, 205-207; Semiconductor Technology Editorial Department, China.

* cited by examiner

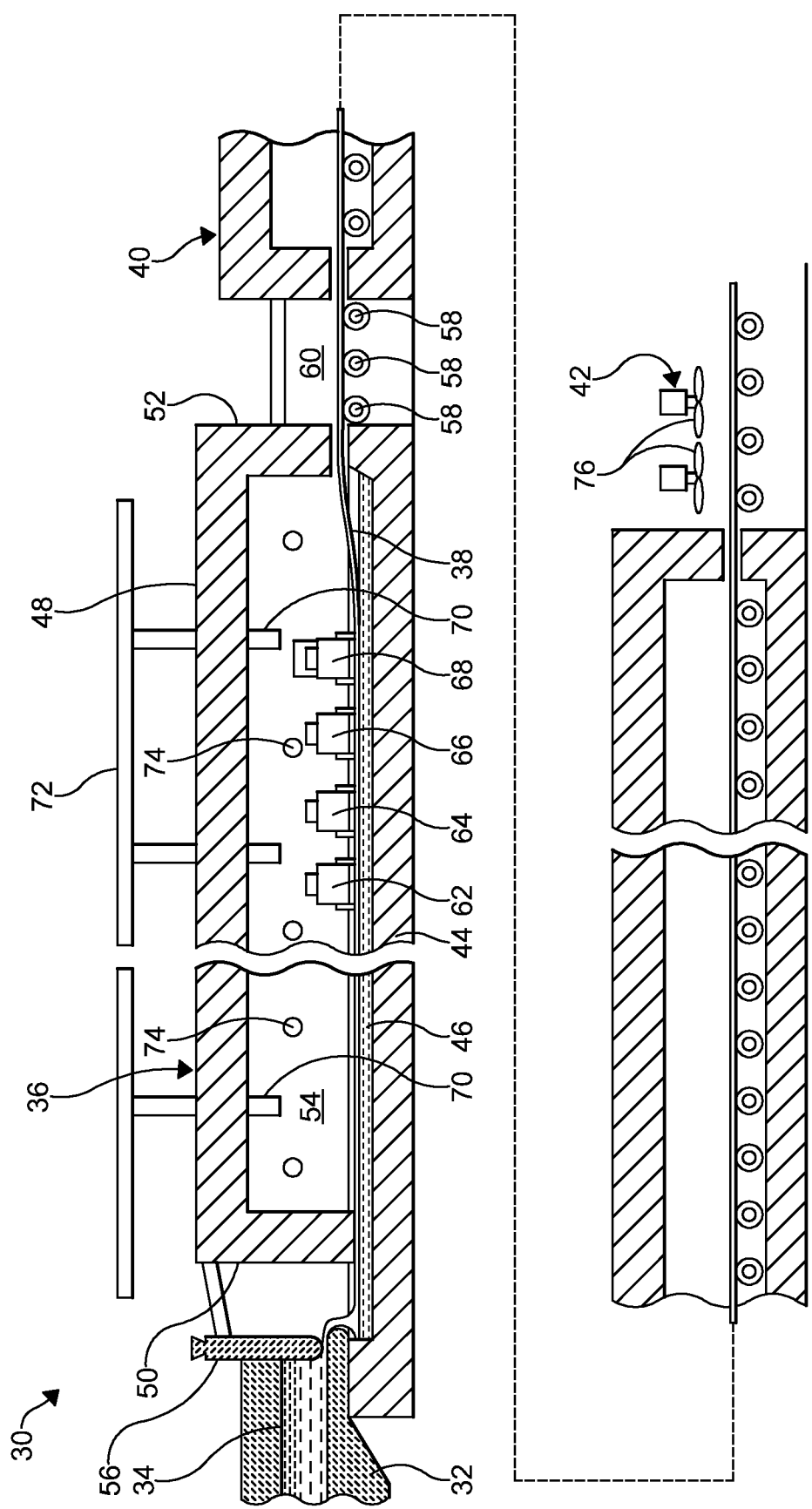

CHEMICAL VAPOR DEPOSITION PROCESS FOR FORMING A SILICON OXIDE COATING

CROSS-REFERENCE TO RELATED APPLICATION

This application is claiming the benefit, under 35 U.S. C. 119(e), of the U.S. provisional patent application which was granted Ser. No. 62/552,713 and filed on Aug. 31, 2017, the entire disclosure of which is hereby incorporated by reference.

BACKGROUND

The invention relates in general to a process for forming a silicon oxide coating. In particular, the invention relates to a chemical vapor deposition (CVD) process for forming a silicon oxide coating over a glass substrate. The invention also relates to a coated glass article having the silicon oxide coating formed thereon.

Silicon oxide coatings are known to be deposited on glass substrates. However, the processes known for the production of the silicon oxide coatings are limited by the efficiency of the deposition process and/or by powder formation (pre-reaction) of the reactive elements. Therefore, it is desired to devise an improved process for the formation of a silicon oxide coating over a glass substrate.

BRIEF SUMMARY

Embodiments of a chemical vapor deposition process for forming a silicon oxide coating are described below. In an embodiment, the chemical vapor deposition process for forming a silicon oxide coating comprises providing a moving glass substrate. A gaseous mixture comprising a silane compound, a first oxygen-containing molecule, a radical scavenger, and at least one of a phosphorus-containing compound and a boron-containing compound is formed. The gaseous mixture is directed toward and along the glass substrate. The gaseous mixture is reacted over the glass substrate to form a silicon oxide coating on the glass substrate at a deposition rate of 150 nm*m/min or more.

In some embodiments, the glass substrate is a glass ribbon in a float glass manufacturing process.

In other embodiments, the silicon oxide coating is formed on a deposition surface of the glass substrate which is at essentially atmospheric pressure.

In still other embodiments, the glass substrate is at a temperature of between 1100° F. (593° C.) and 1400° F. (760° C.) when the silicon oxide coating is formed thereon.

In an embodiment, the gaseous mixture comprises the phosphorus-containing compound.

In some embodiments, the phosphorus-containing compound is an ester.

In an embodiment, the phosphorus-containing compound is triethylphosphite.

In some embodiments, the gaseous mixture comprises less than 0.7 mol % phosphorus-containing compound.

Preferably, the ratio of phosphorus-containing compound to silane compound in the gaseous mixture is 1:100 or more.

Unless it is stated otherwise, all ratios set out in the present application are expressed in mol %.

In some embodiments, the ratio of phosphorus-containing compound to silane compound is between 1:100 and 1:1.

In some embodiments, the gaseous mixture comprises the boron-containing compound.

In some embodiments, the boron-containing compound is an ester.

In an embodiment, the boron-containing compound is triethylborane.

In some embodiments, the ratio of boron-containing compound to silane compound in the gaseous mixture is 1:10 or more.

In some embodiments, the gaseous mixture comprises the phosphorus-containing compound and the boron-containing compound.

In some embodiments, the ratio of boron-containing compound to phosphorus-containing compound in the gaseous mixture is 1:1 or more.

In some embodiments, the ratio of boron-containing compound to phosphorus-containing compound in the gaseous mixture is 2:1 or more.

Preferably, the silane compound is monosilane, the first oxygen-containing molecule is molecular oxygen, the radical scavenger is ethylene.

In some embodiments, the gaseous mixture also comprises a second oxygen-containing molecule. In this embodiment, the first oxygen-containing molecule is molecular oxygen and the second oxygen-containing molecule is water vapor.

In some embodiments, the gaseous mixture comprises more water vapor than molecular oxygen.

In other embodiments, the gaseous mixture comprises 50% or more water vapor based on mol %.

Preferably, the gaseous mixture comprises the phosphorus-containing compound, the boron-containing compound, and a second oxygen containing molecule.

In some embodiments, a coating apparatus is provided and the gaseous is fed through the coating apparatus before forming the silicon oxide coating on the glass substrate.

In some embodiments, the silicon oxide coating is formed over a coating previously formed on the glass substrate.

Preferably, the silicon oxide coating is pyrolytic.

Preferably, the deposition rate is 175 nm*m/min. or more.

In some embodiments, the deposition rate is 200 nm*m/min. or more.

BRIEF DESCRIPTION OF THE VIEW OF THE DRAWING

The above, as well as other advantages of the process will become readily apparent to those skilled in the art from the following detailed description when considered in the light of the accompanying drawings in which the FIGURE is a schematic view, in vertical section, of an installation for practicing the float glass manufacturing process in accordance with an embodiment of the invention.

DETAILED DESCRIPTION

It is to be understood that the invention may assume various alternative orientations and step sequences, except where expressly specified to the contrary. It is also to be understood that the specific articles, apparatuses and processes described in the following specification are simply exemplary embodiments of the inventive concepts. Hence, specific dimensions, directions, or other physical characteristics relating to the embodiments disclosed are not to be considered as limiting, unless expressly stated otherwise. Also, although they may not be, like elements in the various embodiments described within this section of the application may be commonly referred to with like reference numerals.

In an embodiment, a CVD process for forming a silicon oxide coating (hereinafter also referred to as the "CVD process") is provided.

The CVD process will be described in connection with a coated glass article. In certain embodiments, the coated glass article may have applications in the manufacture of solar cells. However, the coated glass article described herein is not limited to solar cell applications. For example, the coated glass article may be utilized in architectural glazings, electronics, and/or have automotive and aerospace applications.

The silicon oxide coating comprises silicon and oxygen. In certain embodiments, the silicon oxide coating may comprise phosphorus. In some of these embodiments, the silicon oxide coating may consist essentially of silicon, oxygen, and phosphorus. In other embodiments, the silicon oxide coating may comprise boron. In some of these embodiments, the silicon oxide coating may consist essentially of silicon, oxygen, and boron. In still other embodiments, the silicon oxide coating may comprise phosphorus and boron. In some of these embodiments, the silicon oxide coating may consist essentially of silicon, oxygen, phosphorus, and boron. The silicon oxide coating may also include a trace amount of one or more additional constituents such as, for example, carbon. As used herein, the phrase "trace amount" is an amount of a constituent of the silicon oxide coating that is not always quantitatively determinable because of its minuteness.

A feature of the CVD process is that it allows for the formation of silicon oxide coatings at commercial viable deposition rates. Additionally, an advantage of the CVD process is that it is more efficient than known processes for forming a silicon oxide coating. Thus, commercially viable deposition rates can be achieved using less silicon-containing precursor compound than in the known processes, which reduces the cost to form the silicon oxide coating. For example, utilizing the CVD process, the silicon oxide coating may be formed at a dynamic deposition rate of 150 nanometers*meter/minute (nm*m/min) or more. Such a deposition rate can be achieved utilizing less silane compound than would be required in the known processes to achieve the same dynamic deposition rate. Additionally, in certain embodiments, the CVD process allows for the formation of silicon oxide coatings at deposition rates that are higher than those of known processes. For example, utilizing the CVD process, the silicon oxide coating may be formed at a dynamic deposition rate of 175 nm*m/min or more. Such a deposition rate can be achieved utilizing about the same amount of silane compound that would be utilized in a comparative process to achieve a lesser dynamic deposition rate. In some embodiments, the silicon oxide coating may even be formed at a dynamic deposition rate of 200 nm*m/min or more.

The silicon oxide coating is formed over a substrate. It should be appreciated that the silicon oxide coating may be formed directly on the substrate or on a coating previously deposited on the substrate. Preferably, the silicon oxide coating is formed over a glass substrate. In an embodiment, the glass substrate has a deposition surface over which the silicon oxide coating is formed.

The CVD process may be carried out in conjunction with the manufacture of the glass substrate. In an embodiment, the glass substrate may be formed utilizing the well-known float glass manufacturing process. An example of a float glass manufacturing process is illustrated in the FIGURE. In this embodiment, the glass substrate may also be referred to as a glass ribbon. However, it should be appreciated that the CVD process can be utilized apart from the float glass manufacturing process or well after formation and cutting of the glass ribbon.

In certain embodiments, the CVD process is a dynamic deposition process. In these embodiments, the glass substrate is moving at the time of forming the silicon oxide coating. Preferably, the glass substrate moves at a predetermined rate of, for example, greater than 3.175 m/min (125 in/min) as the silicon oxide coating is being formed. In an embodiment, the glass substrate is moving at a rate of between 3.175 m/min (125 in/min) and 12.7 m/min (600 in/min) as the silicon oxide coating is being formed.

In certain embodiments, the glass substrate is heated. In an embodiment, the temperature of the glass substrate is about 1100° F. (593° C.) or more when the silicon oxide coating is formed. In another embodiment, the temperature of the glass substrate is between 1100° F. (593° C.) and 1400° F. (760° C.) when the silicon oxide coating is formed thereon.

Preferably, the silicon oxide coating is deposited over the deposition surface of the glass substrate while the surface is at essentially atmospheric pressure. In this embodiment, the CVD process is an atmospheric pressure CVD (APCVD) process. However, the CVD process is not limited to being an APCVD process as, in other embodiments, the silicon oxide coating may be formed under low-pressure conditions.

The glass substrate is not limited to a particular thickness. Also, the glass substrate may be of a conventional glass composition known in the art. In an embodiment, the glass substrate is a soda-lime-silica glass. In some embodiments, the substrate may be a portion of the float glass ribbon. However, the CVD process is not limited to a soda-lime-silica glass substrate as, in other embodiments, the glass substrate may be a borosilicate or aluminosilicate glass.

Also, the transparency or absorption characteristics of the glass substrate may vary between embodiments. For example, in certain embodiments, it may be preferable to utilize a glass substrate having a low iron content, which allows the glass substrate to exhibit a high visible light transmittance. In some embodiments, the glass substrate may comprise 0.15 weight % $Fe_2O_3$ (total iron) or less. As used herein, the phrase "total iron" refers to the total weight of iron oxide (FeO + $Fe_2O_3$) contained in the glass. More preferably, the glass substrate comprises 0.1 weight % $Fe_2O_3$ (total iron) or less, and, even more preferably, a 0.02 weight % $Fe_2O_3$ (total iron) or less. In an embodiment, the glass substrate comprises 0.012 weight % $Fe_2O_3$ (total iron). In these embodiments, the glass substrate may exhibit a total visible light transmittance of 91% or more in the CIELAB color scale system (Illuminant C, ten degree observer). Further, the color of the glass substrate can vary between embodiments of CVD process. In an embodiment, the glass substrate may be substantially clear. In other embodiments, the glass substrate may be tinted or colored.

The silicon oxide coating may be deposited by providing one or more of a source of a silane compound, one or more sources of one or more oxygen-containing molecules, a source of a phosphorus-containing compound, a source of a boron-containing compound, and a source of a radical scavenger. In an embodiment, a source of an oxygen-containing molecule may be a source of water. Separate supply lines may extend from the sources of the reactant (precursor) molecules. As used herein, the phrases "reactant molecule" and "precursor molecule" may be used interchangeably to refer to any or all of the silane compound, one or more oxygen-containing molecules, radical scavenger, phosphorus-containing compound, and boron-containing compound and/or used to describe the various embodiments thereof disclosed herein. Preferably, the sources of the precursor molecules are provided at a location outside the float bath chamber.

Preferably, the silicon oxide coating is deposited by forming a gaseous mixture. It is preferred that the precursor molecules suitable for use in the gaseous mixture are suitable for use in a CVD process. Such molecules may at some point be a liquid or a solid but are volatile such that they can be vaporized for use in the gaseous mixture. In certain embodiments, the gaseous mixture includes precursor molecules suitable for forming the silicon oxide coating at essentially atmospheric pressure. Once in a gaseous state, the precursor molecules can be included in a gaseous stream and utilized to form the silicon oxide coating.

For any particular combination of gaseous precursor molecules, the optimum concentrations and flow rates for achieving a particular deposition rate and coating thickness may vary. However, in order to form the silicon oxide coating, it is preferred that the gaseous mixture comprises a silane compound, one or more oxygen-containing molecules, a radical scavenger, and at least one of a phosphorus-containing compound and a boron-containing compound. In an embodiment, the gaseous mixture comprises a phosphorus-containing compound. In another embodiment, the gaseous mixture comprises a boron-containing compound. In further embodiments, the gaseous mixture may comprise the phosphorus-containing compound and the boron-containing compound.

In an embodiment, the silane compound is monosilane ($SiH_4$). However, other silane compounds are suitable for use in depositing the silicon oxide coating. For example, disilane ($Si_2H_6$) is another silane compound that may be utilized in depositing the silicon oxide coating.

In some embodiments, one or more of the silane compound, radical scavenger, phosphorus-containing compound, and boron-containing compound may comprise one or more oxygen elements. However, it should be appreciated that the phrase "one or more oxygen-containing molecules" refers to one or more molecules included in the gaseous mixture that are separate from the silane compound, radical scavenger, phosphorus-containing compound, and boron-containing compound. The one or more oxygen-containing molecules comprise a first oxygen-containing molecule. In an embodiment, the first oxygen-containing molecule is molecular oxygen ($O_2$), which can be provided as a part of a gaseous composition such as air or in a substantially purified form. In another embodiment, the first oxygen-containing molecule is water ($H_2O$) vapor, which may be provided as steam. In certain embodiments, the one or more oxygen-containing molecules comprises two oxygen-containing molecules. In one such embodiment, the gaseous mixture comprises the first oxygen-containing molecule and a second oxygen-containing molecule. In this embodiment, the first oxygen-containing molecule may be molecular oxygen and the second oxygen-containing molecule may be water vapor or vice versa.

In some embodiments, the gaseous mixture may comprise more water vapor than molecular oxygen. For example, in some embodiments, the ratio of molecular oxygen to water vapor in the gaseous mixture may be 1:20 or more. In one such embodiment, the ratio of molecular oxygen to water vapor in the gaseous mixture is between 1:20 and 1:1. In other embodiments, the ratio of molecular oxygen to water vapor in the gaseous mixture may be 1:15 or more. In one such embodiment, the ratio of molecular oxygen to water vapor in the gaseous mixture is between 1:15 and 1:1.

Additionally, in some embodiments, the gaseous mixture may comprise 50% or more water vapor, which may be based on mol percentage (mol %). In some of these embodiments, the gaseous mixture may comprise 50-90% water vapor. In other embodiments, the gaseous mixture may comprise 50-80% water vapor.

Silane compounds may be pyrophoric and when the one or more oxygen-containing molecules are added to a gaseous mixture comprising a pyrophoric silane compound, a silicon oxide coating such as, for example, silica ($SiO_2$) may be produced. However, the coating is produced at unacceptably high rates and an explosive reaction may result. Known methods of preventing such a reaction result in the deposition of coatings at very low, commercially impractical rates. Known methods are also limited in the amount of silane and oxygen which can be contained in the gaseous mixture, as too high a concentration results in gas phase reaction of the elements, and no coating being produced. Therefore, it is preferred that the gaseous mixture comprises a radical scavenger.

The presence of the radical scavenger allows the silane compound to be mixed with the one or more oxygen-containing molecules without undergoing ignition and premature reaction at the operating temperatures. The radical scavenger further provides control of and permits optimization of the kinetics of the reaction above, near, and/or on the glass substrate. In an embodiment, the radical scavenger is a hydrocarbon gas. Preferably, the hydrocarbon gas is ethylene ($C_2H_4$) or propylene ($C_3H_6$).

In an embodiment, the phosphorus-containing compound is an organic phosphorus-containing compound. Esters are preferred organic phosphorus-containing compounds for use in the gaseous mixture. Thus, in an embodiment, the phosphorus-containing compound is an ester. For example, in an embodiment, the phosphorus-containing compound is triethylphosphite (TEP). In another embodiment, the phosphorus-containing compound may be triethylphosphate (TEPO). However, other phosphorus-containing compounds may be suitable for use in the gaseous mixture.

The benefits of utilizing a phosphorus-containing compound, like the embodiments described above, to form the silicon oxide coating can be realized by selecting a ratio of phosphorus-containing compound to silane compound in the gaseous mixture. For example, in an embodiment, the ratio of phosphorus-containing compound to silane compound in the gaseous mixture is 1:100 or more. In certain embodiments, the ratio of phosphorus-containing compound to silane compound in the gaseous mixture is between 1:100 and 1:1. For example, the ratio of phosphorus-containing compound to silane compound in the gaseous mixture may be 1:50. In some embodiments, the ratio of phosphorus-containing compound to silane compound in the gaseous mixture is between 1:50 and 1:1. In some embodiments, it may be desired to limit the amount of phosphorus-containing compound in the gaseous mixture. In one such embodiment, the mol % of phosphorus-containing compound in the gaseous mixture may be less than 0.7. For example, the gaseous mixture may comprise 0.6 mol % or less phosphorus-containing compound. When the gaseous mixture comprises a phosphorus-containing compound, the silicon oxide coating may comprise a trace amount of phosphorus or more.

When the gaseous mixture comprises a boron-containing compound, it is preferred that the boron-containing compound is an organic boron-containing compound. Thus, in an embodiment, the boron-containing compound is an ester. In one such embodiment, the boron-containing compound is triethylborane (TEB). However, other boron-containing compounds may be suitable for use in the gaseous mixture.

The benefits of utilizing a boron-containing compound, like the embodiments described above, to form the silicon oxide coating can be realized by selecting a ratio of boron-containing compound to silane compound in the gaseous mixture. For example, in an embodiment, the ratio of boron-containing compound to silane compound in the gaseous mixture is 1:10 or more. In an embodiment, the ratio of boron-containing compound to silane compound in the gaseous mixture is between 1:10 and 1:1. In another embodiment, the ratio of boron-containing compound to silane compound in the gaseous mixture is between 1:5 and 1:1. In yet another embodiment, the ratio of boron-containing compound to silane compound in the gaseous mixture is between 1:2 and 1:1.

In certain embodiments where the gaseous mixture comprises a phosphorus-containing compound and a boron-containing compound, it may be preferred that there is more boron-containing compound in the gaseous mixture than phosphorus-containing compound. However, in other embodiments, it may be preferred that there are similar amounts of boron-containing compound and phosphorus-containing compound in the gaseous mixture. In still other embodiments, it may be preferred that there is more phosphorus-containing compound in the gaseous mixture than boron-containing compound. In the embodiments described above, the amount of boron-containing compound and phosphorus-containing compound in the gaseous mixture may be on a mol % basis.

The gaseous mixture may also comprise one or more inert gases utilized as carrier or diluent gas. Suitable inert gases include nitrogen ($N_2$), helium (He), and mixtures thereof. Thus, sources of the one or more inert gases, from which separate supply lines may extend, may be provided.

The precursor molecules are mixed to form the gaseous mixture. As described above, the silane compound can be mixed with one or more oxygen-containing molecules without undergoing ignition and premature reaction due to the presence of the radical scavenger. When provided, it is preferred that the phosphorus-containing compound is also mixed with the silane compound, oxygen-containing molecule(s) and radical scavenger to form the gaseous mixture. Also, when provided, it is preferred that the boron-containing compound is also mixed with the silane compound, oxygen-containing molecule(s), and radical scavenger to form the gaseous mixture. In certain embodiments, the boron-containing compound is mixed with the silane compound, oxygen-containing molecule(s), radical scavenger, and phosphorus-containing compound to form the gaseous mixture.

As described above, in some embodiments, it may be preferred that the gaseous mixture comprises a boron-containing compound and a phosphorus-containing compound. Having both a boron-containing compound and a phosphorus-containing compound in the gaseous mixture may enable the silicon oxide coating to be formed at a deposition rate that is greater than the deposition rate of the silicon oxide coating when only one of the boron-containing compound and phosphorus-containing compound is included in the gaseous mixture. In embodiments where the gaseous mixture comprises a boron-containing compound and a phosphorus-containing compound, the ratio of boron-containing compound to phosphorus-containing compound in the gaseous mixture may be 1:1 or more. In some of these embodiments, it may be preferred that there is more boron-containing compound in the gaseous mixture than phosphorus-containing compound. In one such embodiment, the ratio of boron-containing compound to phosphorus-containing compound in the gaseous mixture may be 2:1 or more.

In certain embodiments, a coating apparatus may be provided. Preferably, the gaseous mixture is fed through the coating apparatus before forming the silicon oxide coating on the glass substrate. The gaseous mixture may be discharged from the coating apparatus utilizing one or more gas distributor beams. Preferably, the gaseous mixture is formed prior to being fed through the coating apparatus. For example, the precursor molecules may be mixed in a feed line connected to an inlet of the coating apparatus. In other embodiments, the gaseous mixture may be formed within the coating apparatus.

An advantage of the CVD process described herein is the significant increase in the deposition rate that occurs and the reduction in the amount of pre-reaction/powder formation that occurs when forming the silicon oxide coating. Hence, the CVD process can be operated for run lengths which are much greater than those of conventional processes. Depending on the thickness of the silicon oxide coating required, the coating formed by the CVD process may be deposited by forming a plurality of silicon oxide coating layers consecutively. However, depending on the desired thickness, another advantage of the CVD process is that only a single coating apparatus may be required for forming the silicon oxide coating.

Preferably, the coating apparatus extends transversely across the glass substrate and is provided at a predetermined distance thereabove. The coating apparatus is preferably located at, at least, one predetermined location. When the CVD process is utilized in conjunction with the float glass manufacturing process, the coating apparatus is preferably provided within the float bath section thereof. However, the coating apparatus may be provided in the annealing lehr, and/or in the gap between the float bath and the annealing lehr.

The gaseous mixture is directed toward and along the glass substrate. Utilizing a coating apparatus aids in directing the gaseous mixture toward and along the glass substrate. Preferably, the gaseous mixture is directed toward and along the glass substrate in a laminar flow.

The gaseous mixture reacts at or near the glass substrate to form the silicon oxide coating thereover. Utilizing the embodiments of the gaseous mixture described above results in the deposition of a high quality coating layer over the glass substrate may be substantially free from defects. Also, the silicon oxide coating may exhibit excellent coating thickness uniformity.

In some embodiments, the silicon oxide coating is pyrolytic. As used herein, the term "pyrolytic" may refer to a coating that is chemically bonded to a glass substrate. In some embodiments, the silicon oxide coating has a refractive index that is less than 1.6. Preferably, the refractive index of the silicon oxide coating is between 1.2 and 1.6.

More preferably, the refractive index of the silicon oxide coating is between 1.2 and 1.5. The refractive index values described above are reported as an average value across 400-780 nm of the electromagnetic spectrum.

In some embodiments, the gaseous mixture comprises a silane compound, a first oxygen-containing molecule, and a radical scavenger. Preferably, the silane compound is monosilane, the first oxygen-containing molecule is molecular oxygen, and the radical scavenger is ethylene. It has been discovered that with the addition of a phosphorus-containing compound or a boron-containing compound to such a gaseous mixture, a silicon oxide coating can be formed as the glass substrate is moving and at a deposition rate of 150 nm*m/min or more. In some embodiments, the silicon oxide coating may be formed as the glass substrate is moving and at a deposition rate of 175 nm*m/min or more. It has been further discovered that when the gaseous mixture comprises a second-oxygen containing molecule such as, for example, water vapor and a phosphorus-containing compound or a boron-containing compound, further increases in the deposition rate of silicon oxide coating can be realized. For example, the silicon oxide coating may be formed as the glass substrate is moving and at a deposition rate of 200 nm*m/min or more. In some embodiments, it may be preferred that the gaseous mixture comprises a second-oxygen containing molecule, a phosphorus-containing compound, and a boron-containing compound.

In some of the embodiments described above, the silicon oxide coating may comprise silicon dioxide ($SiO_2$) and phosphorus. In other embodiments, the silicon oxide coating may comprise silicon dioxide and boron. It should be noted that, in general, increasing the amount of boron-containing compound in the gaseous mixture increases the amount of boron in the silicon oxide coating. In still other embodiments, the silicon oxide coating may comprise silicon dioxide, boron, and phosphorus.

The silicon oxide coating may be formed over one or more previously deposited coatings. For example, the silicon oxide coating may be formed over a previously deposited tin oxide coating, which was formed over the deposition surface of the glass substrate. In this embodiment, the tin oxide coating, over which the silicon oxide coating is to be deposited, may be doped with fluorine or deposited directly on the glass substrate. The silicon oxide coating may be formed directly on the tin oxide coating. Alternatively, the silicon oxide coating may be formed directly on the glass substrate. In this position, the silicon oxide coating may acts as a sodium diffusion barrier between the glass substrate and any coatings formed over the silicon oxide coating. This may be particularly advantageous when the glass substrate is a soda-lime-silica glass.

As discussed, above, the silicon oxide coating may be formed in conjunction with the manufacture of the glass substrate in the well-known float glass manufacturing process. The float glass manufacturing process is typically carried out utilizing a float glass installation such as the installation 30 depicted in the FIGURE. However, it should be understood that the float glass installation 30 described herein is only illustrative of such installations.

As illustrated in the FIGURE, the float glass installation 30 may comprise a canal section 32 along which molten glass 34 is delivered from a melting furnace, to a float bath section 36 where the glass substrate is formed. In this embodiment, the glass substrate will be referred to as a glass ribbon 38. The glass ribbon 38 is a preferable substrate on which the silicon oxide coating is formed. However, it should be appreciated that the glass substrate is not limited to being a glass ribbon.

The glass ribbon 38 advances from the bath section 36 through an adjacent annealing lehr 40 and a cooling section 42. The float bath section 36 includes: a bottom section 44 within which a bath of molten tin 46 is contained, a roof 48, opposite side walls (not depicted) and end walls 50, 52. The roof 48, side walls and end walls 50, 52 together define an enclosure 54 in which a non-oxidizing atmosphere is maintained to prevent oxidation of the molten tin 46.

In operation, the molten glass 34 flows along the canal 32 beneath a regulating tweel 56 and downwardly onto the surface of the tin bath 46 in controlled amounts. On the molten tin surface, the molten glass 34 spreads laterally under the influence of gravity and surface tension, as well as certain mechanical influences, and it is advanced across the tin bath 46 to form the glass ribbon 38. The glass ribbon 38 is removed from the bath section 36 over lift out rolls 58 and is thereafter conveyed through the annealing lehr 40 and the cooling section 42 on aligned rolls. The deposition of the silicon oxide coating preferably takes place in the float bath section 36, although it may be possible for deposition to take place further along the glass production line, for example, in the gap 60 between the float bath 36 and the annealing lehr 40, or in the annealing lehr 40.

As illustrated in the FIGURE, a coating apparatus 62 is shown within the float bath section 36. The silicon oxide coating may be formed utilizing the coating apparatus 62. In this embodiment, the silicon oxide coating may be formed directly on the glass substrate. In certain embodiments, the silicon oxide coating may be formed over one or more coatings previously formed on the glass ribbon 38. Each of these coatings may be formed utilizing a separate coating apparatus. For example, in an embodiment, a coating layer comprising undoped tin oxide may be deposited utilizing a coating apparatus 62, 64. In this embodiment, the silicon oxide coating may be formed directly on or over the undoped tin oxide coating utilizing another coating apparatus 64-68, which is positioned downstream of the coating apparatus 62, 64 utilized to form the undoped tin oxide coating, provided in the float bath section 36 or in another portion of the float glass installation 30 as described above. In another embodiment, a coating apparatus 66 may be provided and utilized to form a coating that comprises fluorine doped tin oxide. In this embodiment, the silicon oxide coating may be formed directly on or over the doped tin oxide coating utilizing a coating apparatus 68 positioned downstream of the coating apparatus 66.

A suitable non-oxidizing atmosphere, generally nitrogen or a mixture of nitrogen and hydrogen in which nitrogen predominates, is maintained in the float bath section 36 to prevent oxidation of the molten tin 46 comprising the float bath. The atmosphere gas is admitted through conduits 70 operably coupled to a distribution manifold 72. The non-oxidizing gas is introduced at a rate sufficient to compensate for normal losses and maintain a slight positive pressure, on the order of between about 0.001 and about 0.01 atmosphere above ambient atmospheric pressure, so as to prevent infiltration of outside atmosphere. For purposes of the describing the invention, the above-noted pressure range is considered to constitute normal atmospheric pressure.

Preferably, the silicon oxide coating is formed at essentially atmospheric pressure. Thus, the pressure of the float bath section 36, annealing lehr 40, and/or in the gap 60 between the float bath section 36 and the annealing lehr 40 may be essentially atmospheric pressure.

Heat for maintaining the desired temperature regime in the float bath section 36 and the enclosure 54 is provided by radiant heaters 74 within the enclosure 54. The atmosphere within the lehr 40 is typically atmospheric air, as the cooling section 42 is not enclosed and the glass ribbon 38 is therefore open to the ambient atmosphere. The glass ribbon 38 is subsequently allowed to cool to ambient temperature. To cool the glass ribbon 38, ambient air may be directed against the glass ribbon 38 as by fans 76 in the cooling section 42. Heaters (not depicted) may also be provided within the annealing lehr 40 for causing the temperature of the glass ribbon 38 to be gradually reduced in accordance with a predetermined regime as it is conveyed therethrough.

EXAMPLES

TABLEs 1-3 are provided below to illustrate the advantages of certain examples of the CVD process. In TABLE 1, examples within the scope of the invention are Ex 1-Ex 4. In TABLE 2, examples within the scope of the invention are Ex 5-Ex 28. A comparative example, not considered to be a part of the invention, is designated in TABLE 2 as C1. In TABLE 3, examples within the scope of the invention are Ex 29-Ex 46. In describing the embodiments of Ex 1-Ex 46, the silicon oxide coating may be designated in the TABLEs and below as $SiO_2$:X, where X is phosphorus, boron, or phosphorus and boron. However, it should be appreciated that Ex 1-Ex 46 are for illustrative purposes only and are not to be construed as a limitation on the invention.

The following experimental conditions are applicable to Ex 1-Ex 4.

The coated glass articles of Ex 1-Ex 4 are of a glass/$SnO_2$/$SiO_2$/$SnO_2$:F/$SiO_2$:X arrangement. The glass substrate was of the soda-lime-silica variety and was moving at the time the coating layers were deposited thereon at a line speed of 3.81 m/min. Prior to forming the silicon oxide coating, a pyrolytic tin oxide ($SnO_2$) coating was deposited on the glass substrate. After forming the tin oxide coating, a pyrolytic silica ($SiO_2$) coating was deposited over the tin oxide coating. A pyrolytic fluorine doped tin oxide ($SnO_2$:F) coating was deposited over the silica coating. After forming the fluorine doped tin oxide coating, a pyrolytic silicon oxide ($SiO_2$:X) coating was deposited over the doped tin oxide coating.

The silicon oxide coatings of Ex 1-Ex 4 were deposited by forming a gaseous mixture. For Ex 1, the gaseous mixture comprised monosilane ($SiH_4$), molecular oxygen ($O_2$), water ($H_2O$) vapor, ethylene ($C_2H_4$), triethylphosphite (TEP), and inert gas. For Ex 2-Ex 4, the gaseous mixture comprised monosilane ($SiH_4$), molecular oxygen ($O_2$), water ($H_2O$) vapor, ethylene ($C_2H_4$), triethylphosphite (TEP), triethylborane (TEB), and inert gas. For each of Ex 1-Ex 4, the precursor molecules were mixed to form the gaseous mixture and then fed through a coating apparatus before being directed toward and along the glass substrate. The mol percentages of the individual gaseous precursor molecules for Ex 1-Ex 4 are as listed in TABLE 1. The balance of the gaseous mixtures of Ex 1-Ex 4 were made up of inert gases.

In TABLE 1, the silicon oxide coating thicknesses are reported in nanometers.

TABLE 1

| Examples | % $SiH_4$ | % $O_2$ | % $C_2H_4$ | % $H_2O$ | % TEP | % TEB | Thickness $SiO_2$: X |
|---|---|---|---|---|---|---|---|
| Ex 1 | 1.00 | 4.00 | 6.00 | 55.0 | 0.10 | 0 | 66.3 |
| Ex 2 | 1.00 | 4.00 | 6.00 | 55.0 | 0.10 | 0.10 | 77.2 |
| Ex 3 | 1.00 | 4.00 | 6.00 | 55.0 | 0.10 | 0.20 | 84.4 |
| Ex 4 | 1.00 | 4.00 | 6.00 | 55.0 | 0.10 | 0.40 | 103.4 |

The composition of the silicon oxide coatings for each of Ex 1-Ex 4 was analyzed using secondary ion mass spectrometry (SIMS). The amount of phosphorus to silicon in the silicon oxide coatings of Ex 1-Ex 4 was similar. The amount of boron to silicon in the silicon oxide coatings of Ex 1-Ex 4 increased from Ex 2 to Ex 4. Since a boron-containing compound was not utilized to form the silicon oxide coating of Ex 1, boron was not detected for the silicon oxide coating of Ex 1.

Referring now to TABLE 2, the following experimental conditions are applicable to C1 and Ex 5-Ex 28. The coated glass article of C1 is of a glass/$SnO_2$/$SiO_2$/$SnO_2$:F/$SiO_2$ arrangement and the coated glass articles of Ex 5-Ex 28 are of a glass/$SnO_2$/$SiO_2$/$SnO_2$:F/$SiO_2$:X arrangement. The glass substrate was of the soda-lime-silica variety and was moving at the time the coating layers were deposited thereon at a line speed of 3.81 m/min.

For C1, a pyrolytic tin oxide ($SnO_2$) coating was deposited on the glass substrate. After forming the tin oxide coating, a pyrolytic silica ($SiO_2$) coating was deposited over the tin oxide coating. A pyrolytic fluorine doped tin oxide ($SnO_2$:F) coating was deposited over the silica coating. After forming the fluorine doped tin oxide coating, a second pyrolytic silica ($SiO_2$) coating was deposited. For Ex 5-Ex 28, prior to forming the silicon oxide coating, a pyrolytic tin oxide ($SnO_2$) coating was deposited on the glass substrate. After forming the tin oxide coating, a pyrolytic silica ($SiO_2$) coating was deposited over the tin oxide coating. A pyrolytic fluorine doped tin oxide ($SnO_2$:F) coating was deposited over the silica coating. After forming the fluorine doped tin oxide coating, a pyrolytic silicon oxide ($SiO_2$:X) coating was deposited over the doped tin oxide coating.

The silicon oxide coatings of Ex 5-Ex 28 were deposited by forming a gaseous mixture. For Ex 5-Ex 9, the gaseous mixture comprised monosilane ($SiH_4$), molecular oxygen ($O_2$), ethylene ($C_2H_4$), triethylphosphite (TEP), and inert gas. For Ex 10-Ex 13, the gaseous mixture comprised monosilane ($SiH_4$), molecular oxygen ($O_2$), ethylene ($C_2H_4$), triethylborane (TEB), and inert gas. For Ex 14-Ex 17, the gaseous mixture comprised monosilane ($SiH_4$), molecular oxygen ($O_2$), ethylene ($C_2H_4$), triethylphosphite (TEP), triethylborane (TEB), and inert gas.

For Ex 18-Ex 22, the gaseous mixture comprised monosilane ($SiH_4$), molecular oxygen ($O_2$), ethylene ($C_2H_4$), water ($H_2O$) vapor, triethylphosphite (TEP), and inert gas. For Ex 23-Ex 28, the gaseous mixture comprised monosilane ($SiH_4$), molecular oxygen ($O_2$), ethylene ($C_2H_4$), water ($H_2O$) vapor, triethylphosphite (TEP), triethylborane (TEB), and inert gas.

For each of Ex 5-Ex 28, the precursor molecules were mixed to form the gaseous mixture and then fed through a coating apparatus before being directed toward and along the glass substrate. The mol percentages of the individual gaseous precursor molecules for Ex 5-Ex 28 are as listed in TABLE 2. The balance of the gaseous mixtures of Ex 5-Ex 28 was made up of inert gases.

In TABLE 2, the silicon oxide coating thicknesses are reported in nanometers.

TABLE 2

| Examples | % $SiH_4$ | % $O_2$ | % $C_2H_4$ | % $H_2O$ | % TEP | % TEB | Thickness $SiO_2$: X |
|---|---|---|---|---|---|---|---|
| C1 | 1.00 | 4.00 | 6.00 | 0 | 0 | 0 | 76.6 |
| Ex 5 | 1.00 | 4.00 | 6.00 | 0 | 0.02 | 0 | 91.8 |
| Ex 6 | 1.00 | 4.00 | 6.00 | 0 | 0.06 | 0 | 86.6 |
| Ex 7 | 1.00 | 4.00 | 6.00 | 0 | 0.10 | 0 | 93.0 |
| Ex 8 | 1.00 | 4.00 | 6.00 | 0 | 0.30 | 0 | 82.7 |
| Ex 9 | 1.00 | 4.00 | 6.00 | 0 | 0.60 | 0 | 64.6 |
| Ex 10 | 1.00 | 4.00 | 6.00 | 0 | 0 | 0.10 | 76.9 |
| Ex 11 | 1.00 | 4.00 | 6.00 | 0 | 0 | 0.20 | 79.7 |
| Ex 12 | 1.00 | 4.00 | 6.00 | 0 | 0 | 0.40 | 84.7 |
| Ex 13 | 1.00 | 4.00 | 6.00 | 0 | 0 | 0.80 | 89.5 |
| Ex 14 | 1.00 | 4.00 | 6.00 | 0 | 0.10 | 0.10 | 98.0 |
| Ex 15 | 1.00 | 4.00 | 6.00 | 0 | 0.10 | 0.20 | 102.7 |
| Ex 16 | 1.00 | 4.00 | 6.00 | 0 | 0.10 | 0.40 | 118.2 |
| Ex 17 | 1.00 | 4.00 | 6.00 | 0 | 0.10 | 0.80 | 136.3 |
| Ex 18 | 1.00 | 4.00 | 6.00 | 55.0 | 0.02 | 0 | 130.3 |
| Ex 19 | 1.00 | 4.00 | 6.00 | 55.0 | 0.06 | 0 | 110.9 |
| Ex 20 | 1.00 | 4.00 | 6.00 | 55.0 | 0.10 | 0 | 85.3 |
| Ex 21 | 1.00 | 4.00 | 6.00 | 55.0 | 0.30 | 0 | 91.6 |
| Ex 22 | 1.00 | 4.00 | 6.00 | 55.0 | 0.60 | 0 | 95.1 |
| Ex 23 | 1.00 | 4.00 | 6.00 | 55.0 | 0.06 | 0.40 | 161.0 |
| Ex 24 | 1.00 | 4.00 | 6.00 | 55.0 | 0.10 | 0.40 | 185.0 |
| Ex 25 | 1.00 | 4.00 | 6.00 | 55.0 | 0.10 | 0.40 | 115.8 |
| Ex 26 | 1.00 | 4.00 | 6.00 | 55.0 | 0.10 | 0.40 | 128.4 |
| Ex 27 | 1.00 | 4.00 | 6.00 | 55.0 | 0.10 | 0.40 | 157.6 |
| Ex 28 | 1.00 | 4.00 | 6.00 | 55.0 | 0.10 | 0.40 | 204.7 |

As shown by Ex 5-Ex 28, the CVD process provides an improved process over the comparative deposition process illustrated by C1. For example, as shown by Ex 5-Ex 28 and comparative deposition process C1, when the mol % s for the silane compound are equal in the gaseous precursor mixture, the thickness of the silicon oxide coating provided by the processes of Ex 5-Ex 28 was greater than that of the coating provided by the comparative deposition process C1.

As shown by Ex 5-Ex 9 and Ex 18-Ex 22, as the mol % of the phosphorus-containing compound increased in the gaseous mixture, the thickness of the silicon oxide coating decreased. In stark contrast, as shown by Ex 10-Ex 13, as the mol % of the boron-containing compound increased in the gaseous mixture, the thickness of the silicon oxide coating increased. Furthermore, as can be observed by Ex 18-Ex 22, when the mol % ratio of $SiH_4$, $O_2$, and $C_2H_4$ is kept relatively equal, for example, at a 1-4-6 ratio, the addition of water vapor to the gaseous mixture generally results in increases in the silicon oxide coating thickness and, thus, an improvement in the deposition rate. Ex 23-Ex 28 further illustrates the effect of utilizing water vapor, a phosphorus-containing compound, and a boron-containing compound in the gaseous mixture. As illustrated in these embodiments, when water vapor is utilized with a phosphorus-containing compound such as, for example, TEP, and a boron-containing compound such as, for example, TEB in the gaseous mixture, the thickness and, thus, the deposition rate of the silicon oxide coating generally increases over embodiments like Ex 14-Ex 17, where only a phosphorus-containing compound and a boron-containing compound are utilized.

Referring now to TABLE 3, the following experimental conditions are applicable to Ex 29-Ex 46. The coated glass articles of Ex 29-Ex 46 are of a glass/$SiO_2$/$SnO_2$:F/$SiO_2$:X arrangement. The glass substrate was of the soda-lime-silica variety, formed in conjunction with a float glass manufacturing process, and was moving at a line speed of 7.57 m/min when the coating layers were deposited in the heated zone of the float glass manufacturing process.

For Ex 29-Ex 46, prior to forming the silicon oxide coating, a pyrolytic silica ($SiO_2$) coating was deposited on the glass substrate. A pyrolytic fluorine doped tin oxide ($SnO_2$:F) coating was deposited over the silica coating. After forming the fluorine doped tin oxide coating, a pyrolytic silicon oxide ($SiO_2$:X) coating was deposited over the doped tin oxide coating.

The silicon oxide coatings of Ex 29-Ex 46 were deposited by forming a gaseous mixture. For Ex 29-Ex 31, the gaseous mixture comprised monosilane ($SiH_4$), molecular oxygen ($O_2$), ethylene ($C_2H_4$), triethylborane (TEB), and inert gas. For Ex 32-Ex 37, the gaseous mixture comprised monosilane ($SiH_4$), molecular oxygen ($O_2$), ethylene ($C_2H_4$), triethylphosphite (TEP), triethylborane (TEB), and inert gas. For Ex 38-Ex 43, the gaseous mixture comprised monosilane ($SiH_4$), molecular oxygen ($O_2$), ethylene ($C_2H_4$), water ($H_2O$) vapor, triethylphosphite (TEP), triethylborane (TEB), and inert gas. For Ex 44-Ex 46, the gaseous mixture comprised monosilane ($SiH_4$), molecular oxygen ($O_2$), ethylene ($C_2H_4$), water ($H_2O$) vapor, triethylphosphite (TEP), and inert gas.

For each of Ex 29-Ex 46, the precursor molecules were mixed to form the gaseous mixture and then fed through a coating apparatus before being directed toward and along the glass substrate. The mol percentages of the individual gaseous precursor molecules for Ex 29-Ex 46 are as listed in TABLE 3. The balance of the gaseous mixtures of Ex 29-Ex 46 were made up of inert gases.

In TABLE 3, the silicon oxide coating thicknesses are reported in nanometers. Also, the deposition rates for the silicon oxide coatings of Ex 29-Ex 46 are reported. In TABLE 3, deposition rates are expressed in two ways:

(1) Dynamic Deposition Rate (DDR) which equals thickness of the silicon oxide coating in nm multiplied by the line speed in m/min. and is expressed as nm*m/min. DDR is useful for comparing coating deposition rates at different line speeds.

(2) Concentration Adjusted—Dynamic Deposition Rate (CA-DDR) equals the DDR divided by the concentration of silane (% $SiH_4$) available in the precursor mixture. The CA-DDR is expressed as (nm*m/min)/% $SiH_4$ and is useful for comparing deposition rates, in this case of silicon oxide coatings, having different precursor concentrations at different line speeds.

TABLE 3

| Examples | % $SiH_4$ | % $O_2$ | % $C_2H_4$ | % $H_2O$ | % TEP | % TEB | Thickness $SiO_2$: X | DDR $SiO_2$: X | CA-DDR $SiO_2$: X |
|---|---|---|---|---|---|---|---|---|---|
| Ex 29 | 0.83 | 3.32 | 4.98 | 0 | 0 | 0.10 | 34.8 | 264 | 31754 |
| Ex 30 | 0.83 | 3.32 | 4.98 | 0 | 0 | 0.40 | 34.2 | 259 | 31216 |
| Ex 31 | 0.83 | 3.32 | 4.98 | 0 | 0 | 0.70 | 31.3 | 237 | 28532 |
| Ex 32 | 0.83 | 3.32 | 4.98 | 0 | 0.10 | 0.70 | 33.7 | 255 | 30733 |
| Ex 33 | 0.83 | 3.32 | 4.98 | 0 | 0.10 | 0.20 | 43.1 | 326 | 39305 |
| Ex 34 | 0.83 | 3.32 | 4.98 | 0 | 0.10 | 0.10 | 37.9 | 287 | 34563 |
| Ex 35 | 0.83 | 3.32 | 4.98 | 0 | 0.05 | 0.10 | 33.4 | 253 | 30459 |
| Ex 36 | 0.83 | 3.32 | 4.98 | 0 | 0.05 | 0.20 | 36.3 | 275 | 33104 |
| Ex 37 | 0.83 | 3.32 | 4.98 | 0 | 0.05 | 0.70 | 31.8 | 241 | 29000 |
| Ex 38 | 0.83 | 3.32 | 4.98 | 50.0 | 0.05 | 0.70 | 38.9 | 294 | 35475 |
| Ex 39 | 0.83 | 3.32 | 4.98 | 50.0 | 0.05 | 0.40 | 37.6 | 285 | 34289 |
| Ex 40 | 0.83 | 3.32 | 4.98 | 50.0 | 0.05 | 0.10 | 29.1 | 220 | 26538 |
| Ex 41 | 0.83 | 3.32 | 4.98 | 50.0 | 0.10 | 0.10 | 36.8 | 279 | 33560 |
| Ex 42 | 0.83 | 3.32 | 4.98 | 50.0 | 0.10 | 0.40 | 50.7 | 384 | 46236 |
| Ex 43 | 0.83 | 3.32 | 4.98 | 50.0 | 0.10 | 0.70 | 41.1 | 311 | 37481 |
| Ex 44 | 0.83 | 3.32 | 4.98 | 50.0 | 0.10 | 0 | 38.4 | 291 | 35062 |
| Ex 45 | 0.83 | 3.32 | 4.98 | 50.0 | 0.05 | 0 | 23.7 | 179 | 21595 |
| Ex 46 | 0.83 | 3.32 | 4.98 | 50.0 | 0.26 | 0 | 42.4 | 321 | 38639 |

As illustrated in TABLE 3, Ex 32-Ex 37 suggest that increases in the thickness and deposition rate for the silicon oxide coating can be achieved by having the mol % of the phosphorus-containing compound similar to the mol % of the boron-containing compound in the gaseous mixture utilized to form the silicon oxide coating. Further, as can be observed by comparing Ex 38-Ex 46 with Ex 29-Ex 37, the addition of water vapor to the gaseous mixture generally results in increases in the silicon oxide coating thickness and deposition rate. Ex 38-Ex 43 further illustrate the effect of utilizing water vapor, a phosphorus-containing compound, and a boron-containing compound in the gaseous mixture. As illustrated in Ex 38-Ex 40, when water vapor is utilized with a phosphorus-containing compound such as, for example, TEP, and a boron-containing compound such as, for example, TEB in the gaseous mixture, the thickness and deposition rate of the silicon oxide coating generally increases as the mol % of boron-containing compound increases in the gaseous mixture. Also, as shown by Ex 44-Ex 46, as the mol % of the phosphorus-containing compound increased in the gaseous mixture, the thickness and deposition rate of the silicon oxide coating increased. In stark contrast, as shown by Ex 29-Ex 31 where water vapor was not included in the gaseous mixture, as the mol % of the boron-containing compound increased in the gaseous mixture, the thickness and deposition rate of the silicon oxide coating decreased.

The foregoing description is considered as illustrative only of the principles of the invention. Further, since numerous modifications and changes will readily occur to those skilled in the art, it is not desired to limit the invention to the exact construction and processes shown and described herein. Accordingly, all suitable modifications and equivalents may be considered as falling within the scope of the invention.

The invention claimed is:

1. A chemical vapor deposition process for forming a silicon oxide coating, comprising:
   providing a moving glass substrate,
   wherein the glass substrate is a glass ribbon in a float glass manufacturing process;
   forming a gaseous mixture comprised of a silane compound, a first oxygen-containing molecule, a radical scavenger, a phosphorus-containing compound and a boron-containing compound;
   directing the gaseous mixture toward and along the glass substrate; and
   reacting the gaseous mixture over the glass substrate to form a silicon oxide coating on the glass substrate at a deposition rate of 150 nm*m/min or more,
   wherein the ratio of boron-containing compound to phosphorus-containing compound in the gaseous mixture is 2:1 or more.

2. The chemical vapor deposition process defined in claim 1, further comprising providing a coating apparatus and feeding the gaseous mixture through the coating apparatus before forming the silicon oxide coating on the glass substrate.

3. The chemical vapor deposition process defined in claim 1, wherein the gaseous mixture also comprises a second oxygen-containing molecule, the first oxygen-containing molecule being molecular oxygen and the second oxygen-containing molecule being water vapor,
   wherein the gaseous mixture comprises more water vapor than molecular oxygen, and/or
   wherein the gaseous mixture comprises 50% or more water vapor based on mol %.

4. The chemical vapor deposition process defined in claim 1, wherein the gaseous mixture comprises a second oxygen containing molecule.

5. The chemical vapor deposition process defined in claim 1, wherein the silicon oxide coating is formed on a deposition surface of the glass substrate which is at essentially atmospheric pressure.

6. The chemical vapor deposition process defined in claim 1, wherein the silicon oxide coating is formed over a coating previously formed on the glass substrate.

7. The chemical vapor deposition process defined in claim 1, wherein the silane compound is monosilane, the first oxygen-containing molecule is molecular oxygen, the radical scavenger is ethylene and/or wherein the glass substrate is at a temperature of between 1100° F. (593° C.) and 1400° F. (760° C.) when the silicon oxide coating is formed thereon.

8. The chemical vapor deposition process defined in claim 1, wherein the deposition rate is 175 nm*m/min. or more and/or wherein the deposition rate is 200 nm*m/min. or more.

9. The chemical vapor deposition process defined by claim 1, wherein the silicon oxide coating is pyrolytic.

10. The chemical vapor deposition process defined in claim 1, wherein the phosphorus-containing compound is an ester and/or wherein the phosphorus-containing compound is triethylphosphite.

11. The chemical vapor deposition process defined in claim 1, wherein gaseous mixture comprises less than 0.7 mol % phosphorus-containing compound.

12. The chemical vapor deposition process defined in claim 1, wherein the boron-containing compound is an ester and/or wherein the boron-containing compound is triethylborane.

13. The chemical vapor deposition process defined in claim 1, wherein the ratio of phosphorus-containing compound to silane compound is between 1:100 and 1:1.

14. The chemical vapor deposition process defined in claim 1, wherein, the ratio of phosphorus-containing compound to silane compound in the gaseous mixture is more than 1:100.

15. The chemical vapor deposition process defined in claim 1, wherein, the ratio of boron-containing compound to silane compound in the gaseous mixture is 1:10 or more.

* * * * *